(12) United States Patent
Frohberg et al.

(10) Patent No.: US 7,482,219 B2
(45) Date of Patent: Jan. 27, 2009

(54) TECHNIQUE FOR CREATING DIFFERENT MECHANICAL STRAIN BY A CONTACT ETCH STOP LAYER STACK WITH AN INTERMEDIATE ETCH STOP LAYER

(75) Inventors: Kai Frohberg, Niederau (DE); Carsten Peters, Dresden (DE); Matthias Schaller, Dresden (DE); Heike Salz, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 223 days.

(21) Appl. No.: 11/424,272

(22) Filed: Jun. 15, 2006

(65) Prior Publication Data

US 2007/0077741 A1    Apr. 5, 2007

(30) Foreign Application Priority Data

Sep. 30, 2005   (DE) ................... 10 2005 046 977

(51) Int. Cl.
*H01L 21/8238* (2006.01)

(52) U.S. Cl. .................. 438/224; 257/E21.63

(58) Field of Classification Search ......... 438/228–231, 438/199, 224, 970; 257/E21.63
See application file for complete search history.

(56) References Cited

U.S. PATENT DOCUMENTS

| 6,573,172 | B1 | 6/2003 | En et al. ............... 438/626 |
| 2003/0181005 | A1 | 9/2003 | Hachimine et al. ....... 438/231 |
| 2005/0093030 | A1 | 5/2005 | Doris et al. ............ 257/288 |
| 2005/0214998 | A1 | 9/2005 | Chen et al. ............ 438/199 |
| 2006/0091471 | A1* | 5/2006 | Frohberg et al. ......... 257/369 |

FOREIGN PATENT DOCUMENTS

DE    102004052578 A1    5/2006

\* cited by examiner

*Primary Examiner*—Richard A. Booth
(74) *Attorney, Agent, or Firm*—Williams, Morgan & Amerson, P.C.

(57) ABSTRACT

The present invention provides a technique for forming differently stressed contact etch stop layers, wherein sidewall spacers are removed prior to the formation of the contact etch stop layers. During the partial removal of respective contact etch stop layers, a corresponding etch stop layer regime is used to substantially avoid any unwanted stress-inducing material residuals, thereby significantly enhancing the stress transfer mechanism.

21 Claims, 8 Drawing Sheets

TECHNIQUE FOR CREATING DIFFERENT MECHANICAL STRAIN BY A CONTACT ETCH STOP LAYER STACK WITH AN INTERMEDIATE ETCH STOP LAYER

BACKGROUND OF THE INVENTION

1. Field of the Invention

Generally, the present invention relates to the formation of integrated circuits, and, more particularly, to the formation of field effect transistors of different conductivity having a channel region with a different specified intrinsic strain to improve the charge carrier mobility in each of the different transistor types.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with a lightly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, substantially depends on the dopant concentration, the mobility of the charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially influences the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control, since reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates great efforts for the adaptation and possibly the new development of process techniques concerning the above-identified process steps, it has been proposed to also enhance device performance of the transistor elements by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach, unless other mechanisms are developed to adjust a desired threshold voltage. Second, the lattice structure in the channel region may be modified, for instance by creating tensile or compressive strain, which results in a modified mobility for electrons and holes, respectively. For example, creating tensile strain in the channel region increases the mobility of electrons, wherein, depending on the magnitude of the tensile strain, an increase in mobility of up to 120% may be obtained, which, in turn, may directly translate into a corresponding increase in the conductivity. On the other hand, compressive strain in the channel region may increase the mobility of holes, thereby providing the potential for enhancing the performance of P-type transistors. Therefore, in some conventional approaches, for instance, a silicon/germanium layer or a silicon/carbon layer is provided in or below the channel region to create tensile or compressive strain therein. Although the transistor performance may be considerably enhanced by the introduction of strain-creating layers in or below the channel region, significant efforts have to be made to implement the formation of corresponding layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

In other approaches, stress from a contact etch stop layer that is required on top of the transistors to control a contact etch process is used to induce strain in the channel regions of the transistors, wherein compressive strain is created in the P-channel transistor, while tensile strain is created in the N-channel transistor.

For this purpose, sidewall spacers may be removed prior to the formation of the contact etch stop layers in order to more closely position the layers to the channel regions and to enhance stress transfer controllability by substantially reducing the effect of the sidewall spacers on the finally achieved strain. However, this conventional approach, although offering substantial performance advantages, may bring about some drawbacks that may partially offset the benefits accomplished by the enhanced strain engineering, as will be described with reference to FIG. 1a-1d.

Figure 1A:
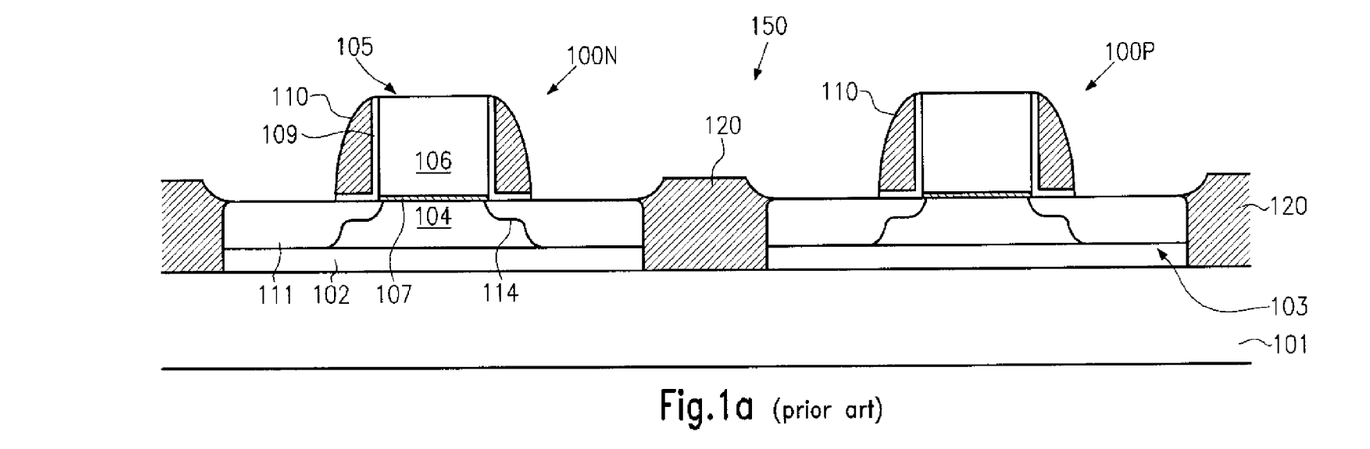
FIGS. 1a-1f schematically show cross-sectional views of a typical conventional semiconductor device including a complementary transistor pair during various manufacturing stages, wherein strain in the respective channel region is generated differently by forming respective contact etch stop layers having different intrinsic stress.

FIG. 1a schematically shows a cross-sectional view of a semiconductor device 150 comprising an NMOS transistor element 100N and a PMOS transistor element 100P. The transistor elements 100N, 100P may be provided in the form of silicon-on-insulator (SOI) devices. Thus, the semiconductor device 150 comprises a silicon substrate 101 having formed thereon an insulating layer 102, such as a buried silicon dioxide layer, followed by a crystalline silicon layer 103. The transistors 100N, 100P may be separated from each other by an isolation structure 120, for instance in the form of a shallow trench isolation. The transistor 100N further comprises a gate electrode structure 105 comprising a polysilicon portion 106. The gate electrode structure 105 further comprises a gate insulation layer 107 separating the gate electrode structure 105 from a channel region 104, which, in turn, laterally separates appropriately doped source and drain regions 111 connected to extensions regions 114. A spacer element 110 is formed adjacent to the sidewalls of the gate electrode structure 105 and is separated therefrom by a liner 109, which is also formed between the source and drain regions 111 and the spacer element 110.

The second transistor 100P may have substantially the same configuration and the same components, wherein the channel region 104 and the drain and source regions 111 include different dopants compared to the respective regions of the transistor 100N.

A typical process flow for forming the semiconductor device 150 as shown in FIG. 1a may comprise the following processes. The substrate 101, the insulating layer 102 and the silicon layer 103 may be formed by advanced wafer bond techniques when the semiconductor device 150 is to represent an SOI device, or the substrate 101 may be provided without the insulating layer 102, as a bulk semiconductor substrate, wherein the silicon layer 103 may represent an upper portion of the substrate, or may be formed by epitaxial growth techniques. Thereafter, the gate insulation layer 107 may be deposited and/or formed by oxidation in accordance with well-established process techniques, followed by the deposition of polysilicon, by means of low pressure chemical vapor deposition (LPCVD). Thereafter, the polysilicon and the gate insulation layer 107 may be patterned by sophisticated photolithography and etch techniques in accordance with well-established process recipes. Next, implantation cycles, in combination with the manufacturing process for forming the spacer element 110, may be performed, wherein the spacer element 110 may be formed as two or more different spacer elements with intermediate implantation processes when a sophisticated laterally profiled dopant concentration is required for the drain and source regions 111. For example, the extension regions 114 of reduced penetration depth may be required. Next, any anneal cycles for activating and partially curing implantation-induced crystal damage may follow.

Thereafter, the spacer elements 110 may be removed by well-established highly selective etch recipes, wherein the etch chemistry is selected so as to be selective with respect to polysilicon and silicon dioxide, so that the spacer 110, comprised of silicon nitride, may be efficiently removed substantially without significant material erosion in the polysilicon portion 106 and the drain and source regions 111. Next, metal silicide regions may be formed in the polysilicon portion 106 and the drain and source regions 111 by depositing a refractory metal, such as cobalt, nickel and the like, and performing an appropriate anneal sequence for initiating a chemical reaction between the silicon and the refractory metal.

Figure 1B:
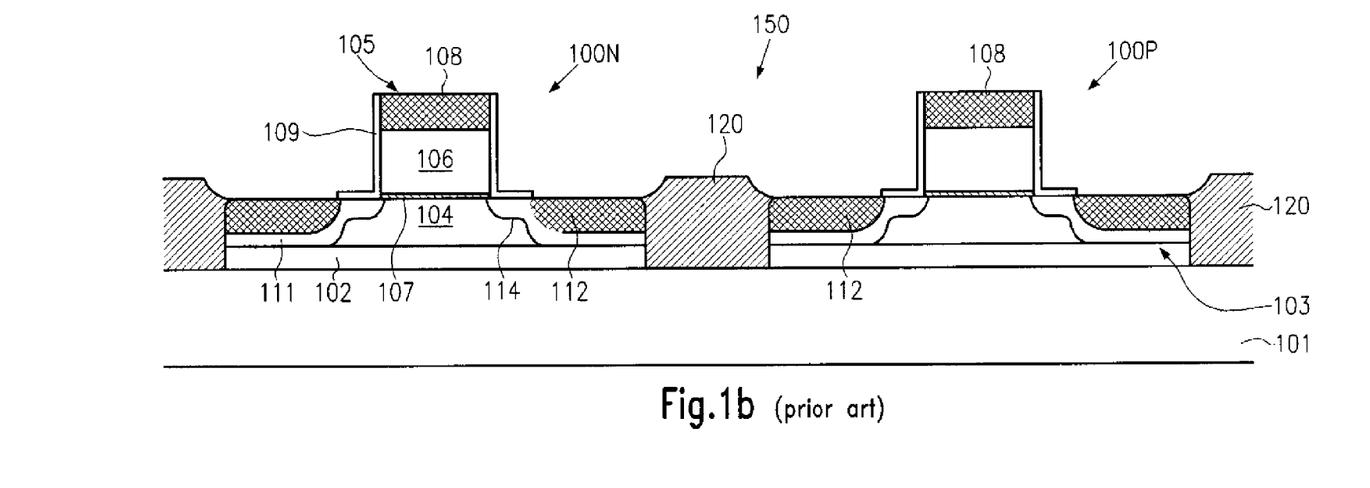

FIG. 1b schematically shows the semiconductor device 150 after the completion of the above-described process sequence. Hence, the device 150 comprises metal silicide regions 112 in and on the drain and source regions 111 and a corresponding metal silicide region 108 in the gate electrodes 105. Thereafter, a dielectric layer stack is formed for providing a first contact etch stop layer having a specified intrinsic stress.

Figure 1C:
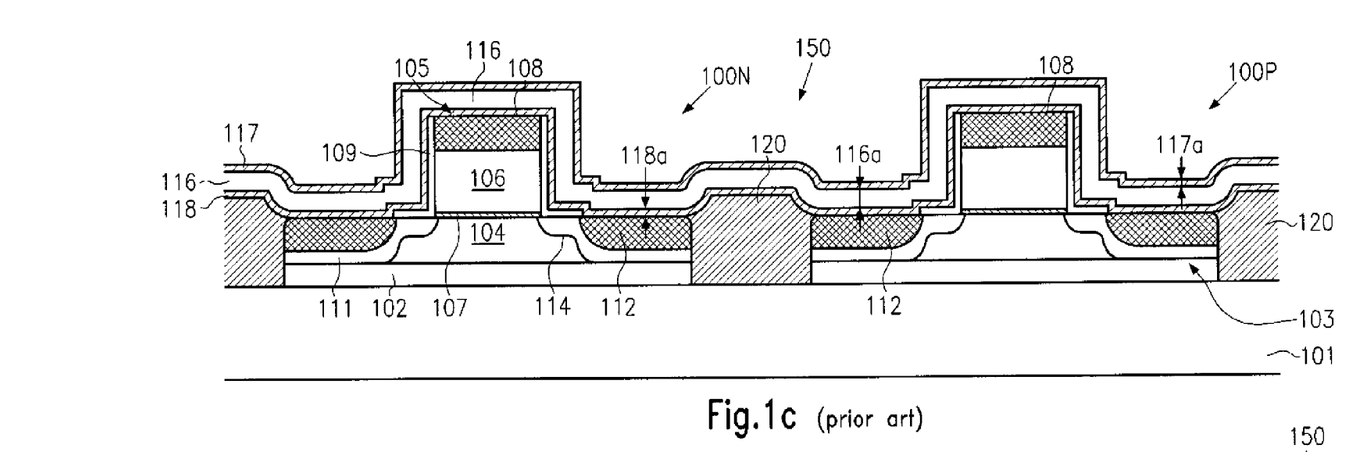

FIG. 1c schematically shows the semiconductor device 150 with a first contact etch stop layer 116 formed on a first etch stop layer 118 and a second etch stop layer 117 formed above the first contact etch stop layer 116. Typically, the transistor elements 100N, 100P are embedded in an interlayer dielectric material (not shown in FIG. 1c), over which corresponding metallization layers are to be formed to establish the required electrical connections between the individual circuit elements. The interlayer dielectric material has to be patterned to provide contact to the gate electrode structure 105 and the drain and source regions 111 by means of an anisotropic etch process. Since this anisotropic etch process has to be performed to different depths, a reliable etch stop layer, that is, the contact etch stop layer 116, in addition to a second etch stop layer still to be formed, is provided to reliably control the etch process. Frequently, the interlayer dielectric material is comprised of silicon dioxide and thus the contact etch stop layer 116 may comprise silicon nitride, as silicon nitride exhibits a good etch selectivity for well-established anisotropic recipes for etching silicon dioxide. Moreover, silicon nitride may be deposited in accordance with well-established deposition recipes, wherein the deposition parameters may be appropriately adjusted for providing a specified intrinsic mechanical stress while nevertheless maintaining the desired high etch selectivity to silicon dioxide. Typically, silicon nitride is deposited by plasma enhanced chemical vapor deposition (PECVD) wherein, for example, parameters of the plasma atmosphere, such as bias power supplied to the plasma atmosphere, may be varied in order to adjust the mechanical stress created in the silicon nitride layer as deposited. Thus, the stress in the first contact etch stop layer 116 may be determined by the deposition conditions, wherein, for instance, a compressive stress in silicon nitride up to approximately 1.5 GPa and also a tensile stress up to approximately 1.5 GPa may be achieved by appropriately selecting deposition parameters.

The first etch stop layer 118 and the second etch stop layer 117 may exhibit a significantly reduced thickness compared to the contact etch stop layer 116, since especially the first etch stop layer 118 may act, in principle, as an unwanted "buffer" layer, which may reduce, to a certain degree, the mechanical stress transferred from the respective contact etch stop layer into the channel regions 104. The layers 118 and 117 may be provided in the form of silicon dioxide.

Figure 1D:
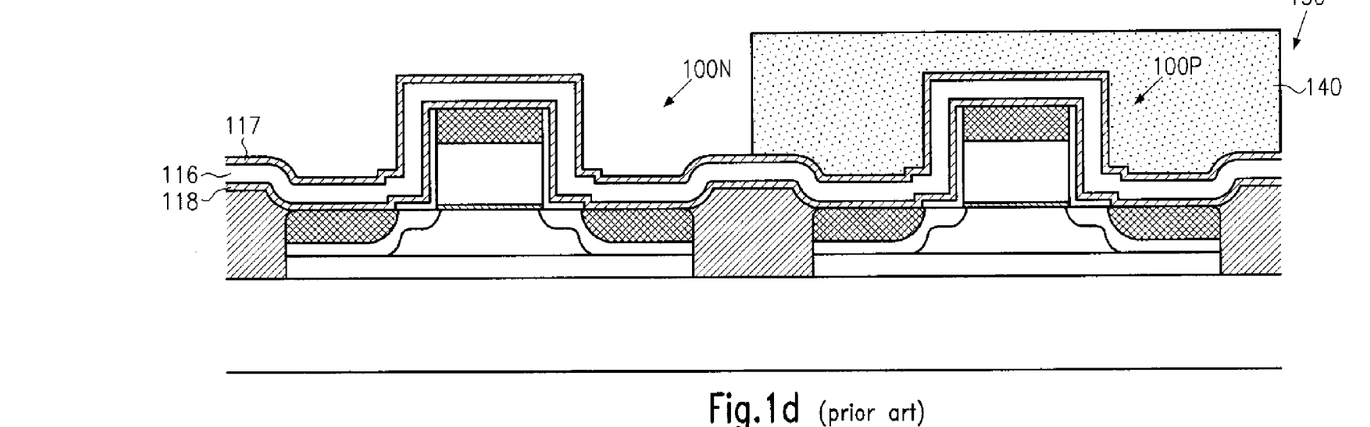

FIG. 1d schematically shows the semiconductor device 150 with a resist mask 140 that exposes the first transistor element 100N and the layer portions formed thereon, while covering the second transistor 100P and the layer portions formed thereon. Based on the resist mask 140, the exposed second etch stop layer 117 may be removed on the basis of an isotropic etch process, thereby leaving residues 117R (see FIG. 1e) at sidewall portions of the layer 116. Subsequently, the resist mask 140 may be removed or may be maintained during a further etch process for removing the first contact etch stop layer 116 formed above the first transistor 100N.

Figure 1E:
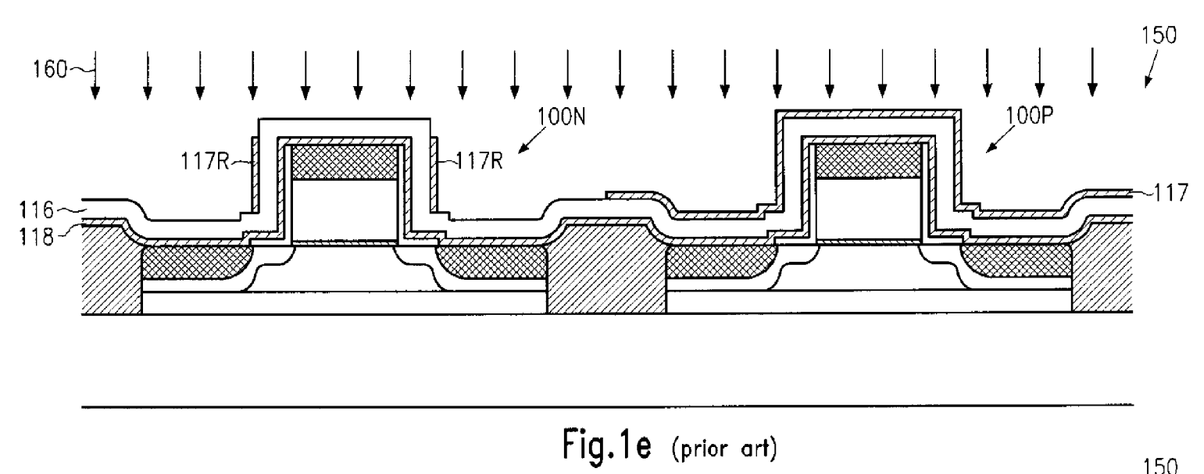

FIG. 1e schematically shows the device 150, with the resist mask 140 and the etch stop layer 117 above the first transistor 100N removed, except for the residues 117R. Moreover, the device 150 is subjected to an etch process 160 for removing substantial portions of the first contact etch stop layer 116 above the first transistor element 100N, wherein the remaining second etch stop layer 117 above the transistor 100P may act as an etch mask, while the residues 117R may negatively affect the removal process in the transistor 100N.

Figure 1F:
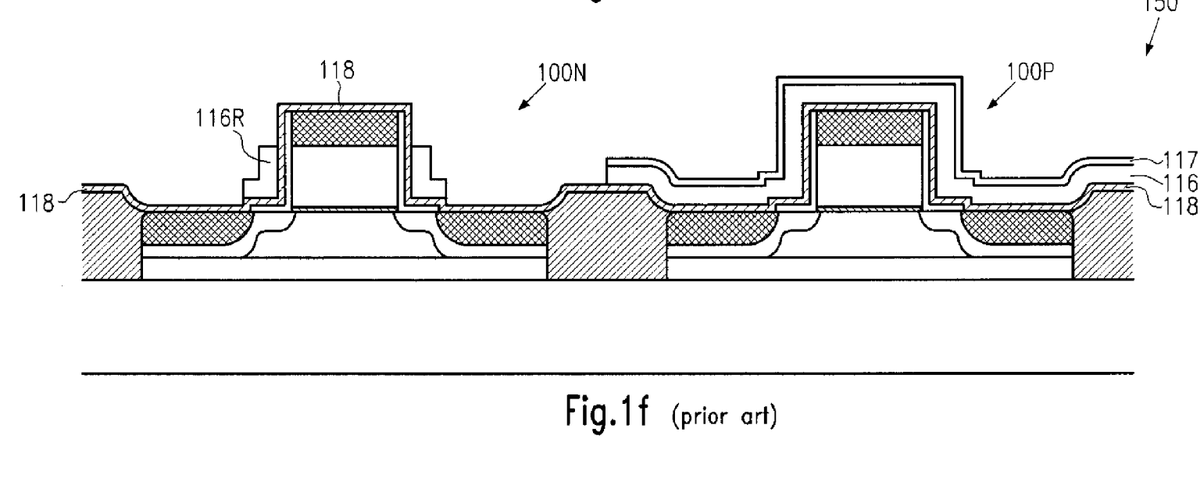

FIG. 1f schematically shows the device 150 after the completion of the above-described etch process 160. Due to the residues 117R during the etch process 160, residuals of the first contact etch stop layer 116, referred to as 116R, may be left on sidewalls of the gate structure 105, thereby significantly affecting the stress transfer mechanism in the first transistor 100N after a second contact etch stop layer (not shown) is deposited with a corresponding intrinsic stress, as is required for performance enhancement of the first transistor element 100N. For example, if the first contact etch stop layer 116 is provided with compressive stress so as to enhance performance of the transistor 100P, the mechanism for transferring tensile stress into the channel region of the first transistor 100N by forming an appropriate second contact etch stop layer is at least partially compensated for by the residual "spacers" 116R having the compressive stress. A further "over-etching" during the etch process 160 may, however, be less desirable so as to not unduly deteriorate the etch stop layer 118, thereby otherwise risking a high degree of metal silicide degradation, which may then negatively impact the further device processing, as well as the electrical performance thereof.

In view of the situation described above, there exists a need for an improved technique that enables an efficient stress transfer mechanism while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the creation of a desired strain within the channel regions of transistor elements having different characteristics by providing different types of stress-inducing contact etch stop layers above the respective transistor elements, wherein a highly efficient stress transfer mechanism is provided in that corresponding sidewall spacer elements are removed prior to the formation of the corresponding contact etch stop layers. Moreover, a high degree of device integrity is provided, as sensitive metal silicide regions remain substantially intact during any etch procedures for creating two different contact etch stop layers. In addition, the technique according to the present invention enables superior efficiency in removing any residuals of a non-wanted portion of a respective contact etch stop layer by appropriately providing an etch stop layer regime, in which the etch efficiency during the removal of the non-wanted layer portion is enhanced.

According to one illustrative embodiment of the present invention, a method comprises forming a first etch stop layer above a first transistor element and a second transistor element and forming a first contact etch stop layer above the first etch stop layer, wherein the first contact etch stop layer has a first type of intrinsic stress. Furthermore, the method comprises forming a first mask layer above the first and second transistor elements to expose the first transistor element and cover the second transistor element. Additionally, a first portion of the first contact etch stop layer formed above the first transistor element is removed by an etch process using the first etch stop layer as an etch stop. Furthermore, the method comprises forming a second etch stop layer above the first and second transistor elements and forming a second contact etch stop layer on the second etch stop layer, wherein the second contact etch stop layer has a second type of intrinsic stress that differs from the first type.

According to another illustrative embodiment of the present invention, a semiconductor device comprises a first transistor element having a first channel region and a first dielectric layer stack enclosing the first transistor element, wherein the first dielectric layer stack comprises a first etch stop layer, a second etch stop layer and a first contact etch stop layer, wherein the first dielectric layer stack induces a first strain in the first channel region. Furthermore, the semiconductor device comprises a second transistor element having a second channel region and a second dielectric layer stack enclosing the second transistor element, wherein the second dielectric layer stack comprises the first etch stop layer and a second contact etch stop layer, and wherein the second dielectric layer stack induces a second strain in the second channel region which differs from the first strain.

According to yet another illustrative embodiment of the present invention, a semiconductor device comprises a first transistor element having a first channel region and a first dielectric layer stack enclosing the first transistor element, wherein the first dielectric layer stack comprises a first etch stop layer of a first thickness formed on the first transistor element and further comprises a first contact etch stop layer, wherein the first dielectric layer stack induces a first strain in the first channel region. Moreover, the semiconductor device comprises a second transistor element having a second channel region and a second dielectric layer stack which encloses the second transistor element and comprises a second etch stop layer formed on the second transistor element and having a second thickness that is less than the first thickness. Moreover, the second dielectric layer stack further comprises a second contact etch stop layer and induces a second strain in the second channel region which differs from the first strain.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that an effective strain engineering in the channel regions of different transistor types may be accomplished by providing differently stressed contact etch stop layers, wherein the stress transfer mechanism may be enhanced by improving the removal efficiency of any unwanted layer portions, while at the same time a high degree of integrity of sensitive metal silicide regions is maintained. For this purpose, an appropriate etch stop layer configuration is provided such that, on the one hand, an unwanted portion of a contact etch stop layer formed above one transistor element may be efficiently removed, while, nevertheless, a reliable etch process with respect to removing an unwanted contact etch stop layer portion from the other transistor type is guaranteed, whereas sensitive device regions remain covered throughout the whole contact etch stop layer manufacturing process.

Figure 2A:
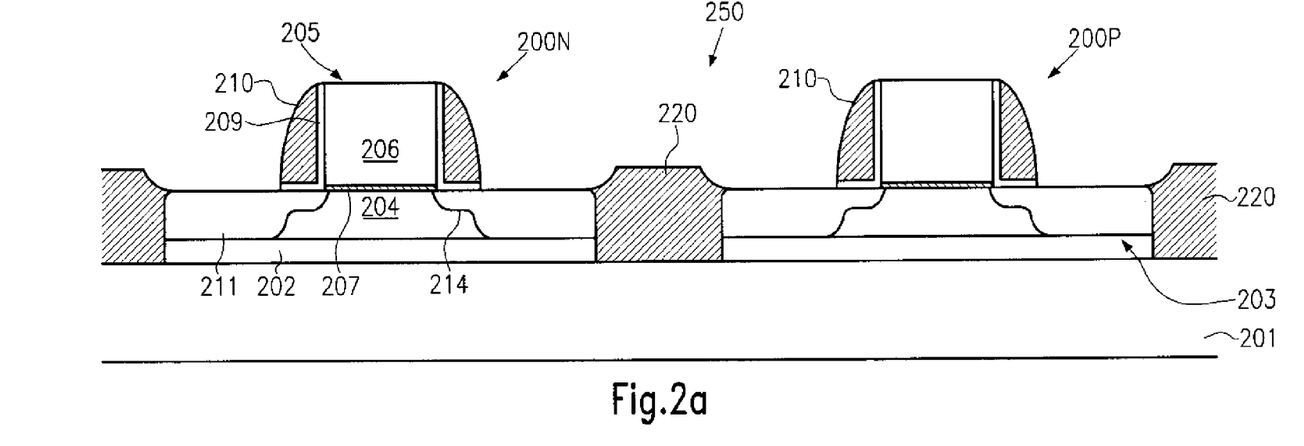
FIGS. 2a-2g schematically show cross-sectional views of a semiconductor device during the formation of respective dielectric layer stacks including contact etch stop layers with different intrinsic stress, wherein an efficient removal of any residues of an unwanted contact etch stop layer portion is achieved according to illustrative embodiments of the present invention.

With reference to FIGS. 2a-2f, further illustrative embodiments of the present invention will now be described in more detail. FIG. 2a schematically shows a cross-sectional view of a semiconductor device 250 comprising a first transistor element 200N and a second transistor element 200P. The transistor elements 200N, 200P may represent different types of transistor elements, such as an N-channel transistor and a P-channel transistor, or transistors of the same or different types located at very different die locations or substrate locations. In one illustrative embodiment, the transistor 200N may represent an N-channel transistor and the second transistor element 200P may represent a P-channel transistor, which in combination may be arranged to form a complementary transistor pair. Although the transistors 200N and 200P may differ from each other in size, conductivity type, location, function and the like, for convenience they are shown to have substantially the same configuration, and hence corresponding components of the transistors 200N, 200P are denoted by the same reference numerals. It should also be noted that, although the present invention is particularly advantageous for transistor elements without any additional stress-inducing components, such as additional epitaxy layers formed in or below the respective channel regions, the present invention may also be combined with such additional strain-creating techniques. It should also be appreciated that, in the following description of further illustrative embodiments of the present invention, it is referred to transistor elements provided in the form of SOI devices according to a standard transistor architecture without using raised drain and source regions. As will become apparent from studying the following description, the present invention may also be applied to transistor elements formed on bulk semiconductor substrates using a device architecture with or without raised drain and source regions.

The semiconductor device 250 comprises a substrate 201, which may have formed thereon an insulating layer 202, such as a buried silicon dioxide layer, a silicon nitride layer and the like, followed by a crystalline semiconductor layer 203, which may be comprised of silicon, since the vast majority of integrated circuits including complex logic circuitry is based on silicon. It should be appreciated, however, that the semiconductor layer 203 may be comprised of any appropriate semiconductor material in accordance with design requirements. As previously explained, the substrate 201 may also represent a bulk substrate without the insulating layer 202. The first and second transistors 200N, 200P may be separated from each other by any appropriate isolation structure 220, which may be provided, for instance, in the form of a shallow trench isolation. The first and second transistors 200N, 200P further comprise a gate electrode structure 205 including a semiconductor portion 206, such as a polysilicon portion, in and on which a metal silicide is to be formed. The gate electrode structure 205 further comprises a gate insulation layer 207 separating the gate electrode structure 205 from a channel region 204, which in turn laterally separates appropriately doped source and drain regions 211 including corresponding extension regions 214. A spacer element 210 is formed adjacent to sidewalls of the gate electrode structure 205 and is separated therefrom by a liner 209. The second transistor 200P may have substantially the same configuration, wherein, however, due to the difference to the first transistor 200N, the various components may differ in the dopant concentration, the size and the like. That is, the channel region 204 and the drain and source regions 211 including the respective extension regions 214 may be inversely doped with respect to the first transistor 200N when the first and second transistors 200N, 200P represent transistor elements of a different conductivity type.

The semiconductor device 250 as shown in FIG. 2a may be formed on the basis of well-established process techniques as are, for instance, described with reference to FIG. 1a. Moreover, after any process techniques for forming the device 250 as shown in FIG. 2a, the spacer elements 210 may be removed on the basis of well-established selective etch techniques and subsequently metal silicide regions may be formed in accordance with well-established techniques.

Figure 2B:
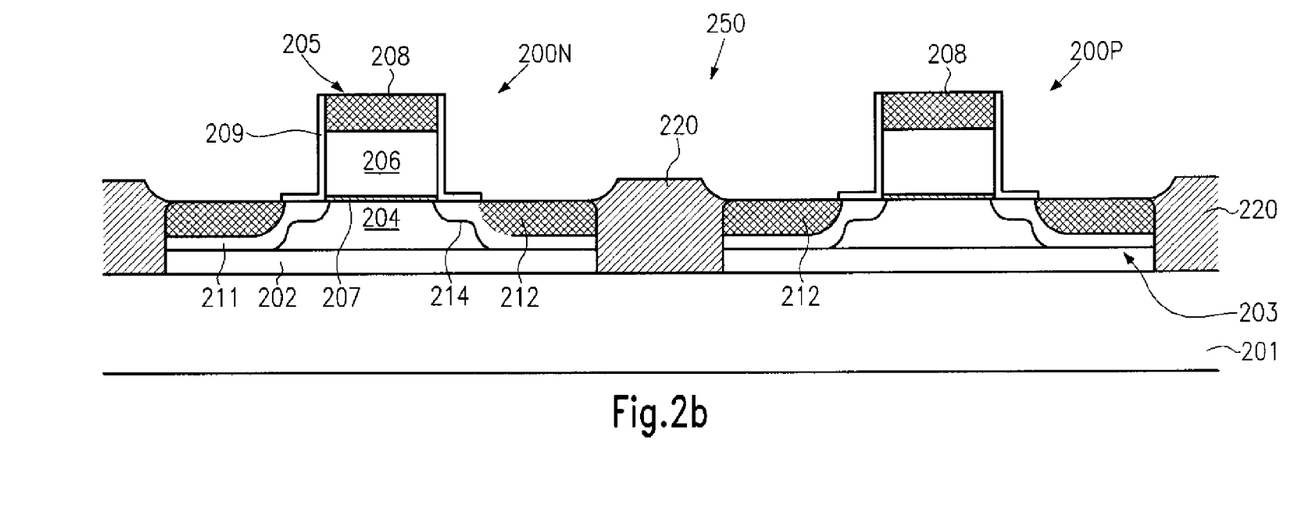

FIG. 2b schematically shows the device 250 having formed therein and thereon respective metal silicide regions 208 in the polysilicon portions 206 and metal silicide regions 212 formed in the respective drain and source regions 211.

Figure 2C:
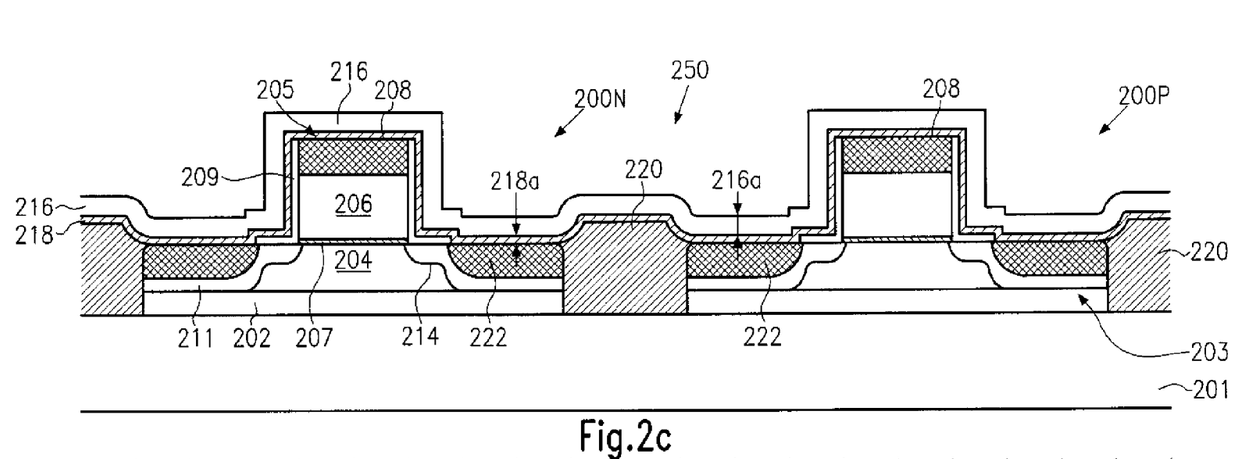

FIG. 2c schematically shows the semiconductor device 250 in a further advanced manufacturing stage. A first etch stop layer 218 is formed on the first and second transistor elements 200N, 200P with a first thickness 218a, which is selected so as to provide efficient protection for the underlying sensitive metal silicide regions 208, 212, while on the other hand enabling a moderately high efficiency in transferring stress into the lower-lying device regions. For instance, the first etch stop layer 218 may be formed with a thickness of approximately 5-30 nm and may be comprised of silicon dioxide, silicon oxynitride, silicon carbide, silicon oxycarbide and the like. In one illustrative embodiment, the first etch stop layer 218 is comprised of silicon dioxide having a thickness in the above-specified range. A first contact etch stop layer 216 is formed on the first etch stop layer 218 and is provided with a specified type of intrinsic stress, such as compressive or tensile, with a desired magnitude. As previously explained, silicon nitride is a viable base material that exhibits an excellent etch selectivity to silicon dioxide and also enables the creation of compressive and tensile stress over a wide range by merely adjusting the deposition parameters. Depending on the subsequent process flow, the first contact etch stop layer 216 may therefore be provided in the form of a silicon nitride based layer with a specified compressive or tensile stress. Contrary to the conventional approach as previously described with reference to FIG. 1c, the first contact etch stop layer 216 remains uncovered and the process flow is continued by forming an appropriate mask for exposing one of the transistor elements and its corresponding layer portions, while covering the other transistor and its corresponding layer portions.

Figure 2D:
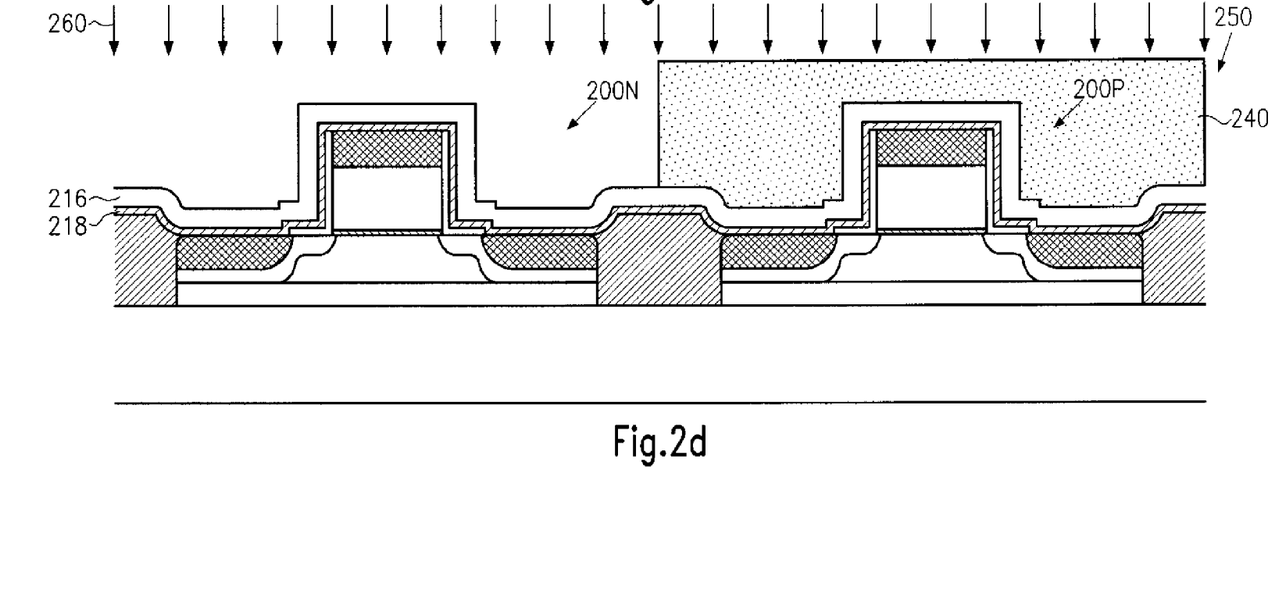

FIG. 2d schematically shows the semiconductor device 250 after the formation of a respective etch mask 240, which may be provided in the form of a resist mask. The resist mask 240 may have an appropriate configuration to withstand a subsequent etch process for removing the first contact etch stop layer 216 over the first transistor element 200N. Hereby, well-established recipes and photoresist materials in appropriate photolithography techniques may be used. Consequently, during a subsequent etch process 260, the first contact etch stop layer 216 covered by the mask 240 remains substantially intact, while the exposed portion of the layer 216 may be efficiently removed. Contrary to the conventional approach, using the present methodology, substantially all of the sidewall portions may be efficiently attacked during the etch process 260. As a consequence, the material of the exposed portion of the layer 216 may be substantially completely removed, thereby significantly reducing any effect on the stress transfer mechanism of a second contact etch stop layer still to be formed above the first transistor element 200N.

Figure 2E:
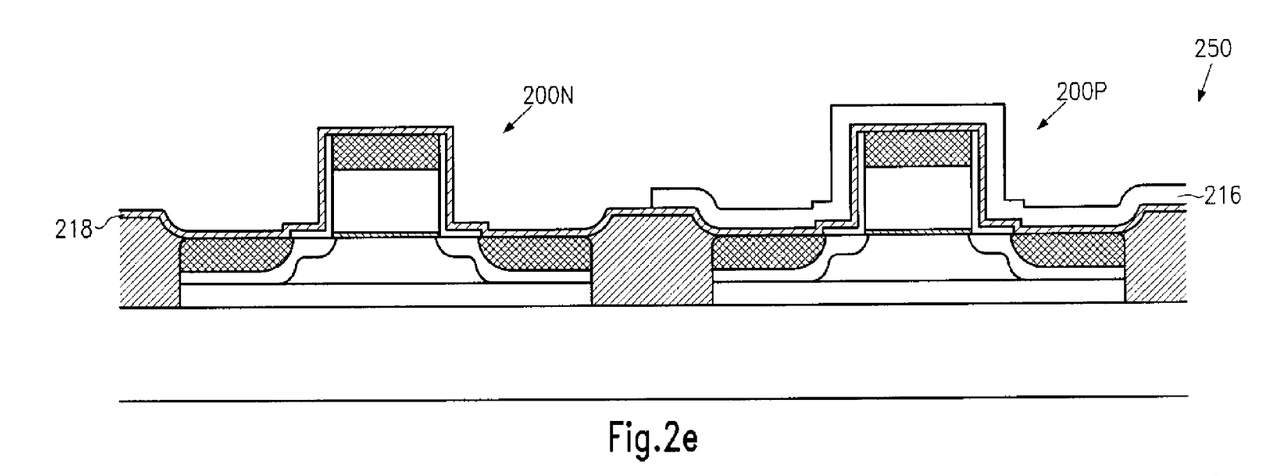

FIG. 2e schematically shows the device 250 after the completion of the etch process 260 and after the removal of the resist mask 240. It should be appreciated that, although the exposed portion of the etch stop layer 218 may have experienced a significant erosion during the preceding etch process 260, any impact on the sensitive metal silicide regions 208, 212 in the first transistor element 200N may nevertheless have been efficiently suppressed.

Figure 2F:
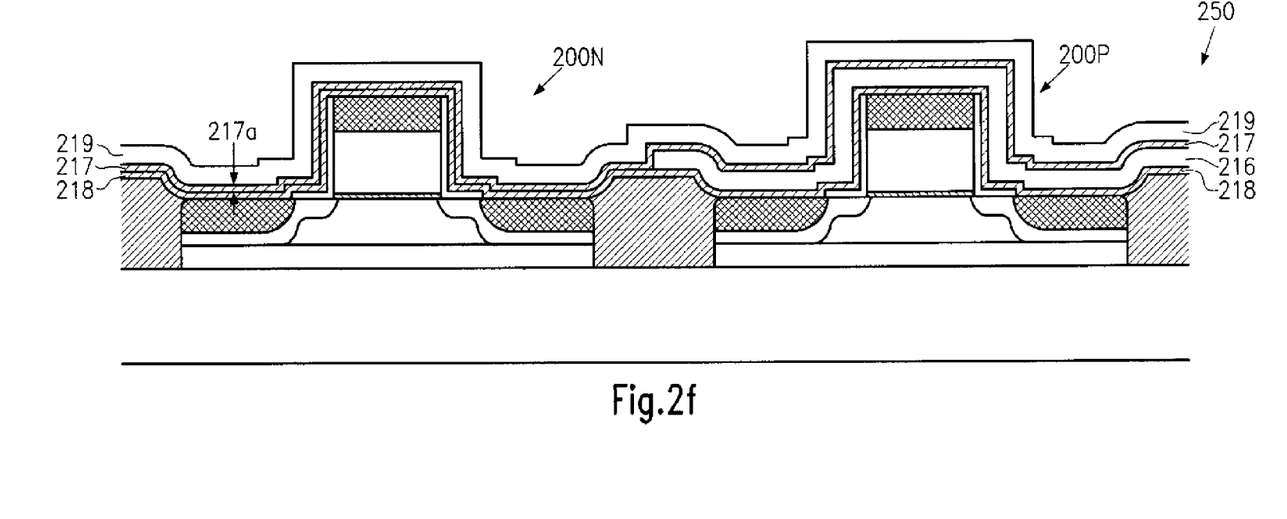

FIG. 2f schematically shows the semiconductor device 250 in a further advanced manufacturing stage. A second etch stop layer 217 is formed on the exposed portion of the first etch stop layer 218 and on the remaining portion of the first contact etch stop layer 216. Moreover, a second contact etch stop layer 219 is formed on the second etch stop layer 217, wherein the layer 219 has a second type of stress that differs from the first type included in the layer portion 216. For example, if the first transistor 200N represents an N-channel transistor, the second contact etch stop layer 219 may comprise tensile stress so as to create a respective tensile strain in the channel region 204. For example, the second contact etch stop layer 219 may be a silicon nitride based material, wherein a respective magnitude and type of stress may therefore be obtained on the basis of correspondingly adjusted deposition parameters during the formation of the layer 219. Moreover, a thickness of the second etch stop layer 217, indicated as 217a, may be selected such that, with a given material composition, an efficient control of a subsequent etch process for removing the portion of the layer 219 formed above the second transistor element 200P may be achieved. For example, the second etch stop layer 217 may be provided in the form of a silicon dioxide layer, a silicon oxynitride layer, a silicon carbide layer, a silicon oxycarbide layer and the like, with a thickness in the range of approximately 5-30 nm. In view of a high efficiency for transferring stress from the layer 219 to the respective channel region 204 of the first transistor element 200N, a thickness of approximately 5-10 nm may be used in some illustrative embodiments.

With respect to the formation of the second contact etch stop layer 219 and the second etch stop layer 217, the same criteria apply as previously explained with reference to the layers 218 and 216 and the layers 118, 117, 116 and 119 explained with reference to FIGS. 1b-1g. It should be appreciated that, although a somewhat increased thickness of "buffer" material may be provided between the second contact etch stop layer 219 and the underlying material regions, a significantly enhanced stress transfer mechanism is nevertheless accomplished, since any residues, such as the residues 116 (FIG. 1f), may be substantially avoided.

Then, further processing may be continued by forming an appropriate resist mask or any other mask for covering the first transistor element 200N, while exposing the second transistor element 200P and the layer portion 219 formed thereabove. Thereafter, a further etch process may be performed to remove the exposed portion of the layer 219, while the corresponding etch process may be reliably stopped or at least sufficiently controlled on the basis of the second etch stop layer 217. Depending on the type of material used in the layer 217, the layer 217 may also be removed in a subsequent etch process or may be maintained, since the material may be substantially the same as a subsequently deposited interlayer dielectric material, as is previously explained. Thereafter, the interlayer dielectric material may be deposited and may be planarized in accordance with well-established processes.

Figure 2G:
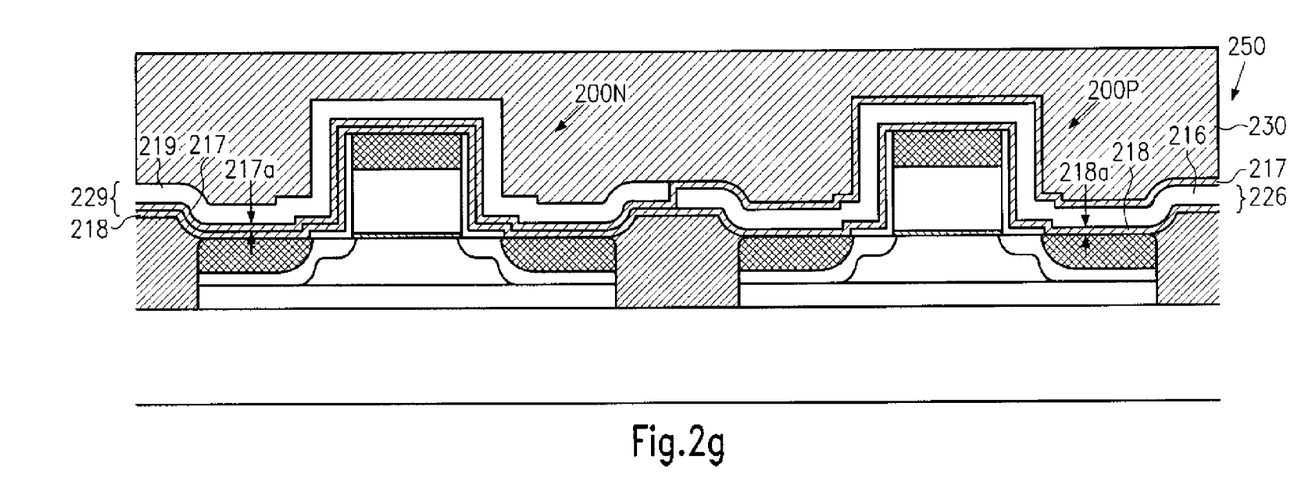

FIG. 2g schematically shows the semiconductor device 250 after the completion of the above-described process sequence. Hence, the device 250 comprises a first dielectric layer stack 229 formed on the first transistor element 200N and comprised of the layers 218, 217 and 219. Moreover, the device 250 comprises a second dielectric layer stack 226 formed by the first etch stop layer 218 and the first contact etch stop layer 216. In the embodiment shown, the layer portion 217 formed above the second transistor 200P may be assumed to be comprised of substantially the same material as an interlayer dielectric material 230 formed above the first and second dielectric layer stacks 229 and 226. Moreover, the first and second etch stop layers 218 and 217 may be substantially comprised of the same material, such as silicon dioxide, and may thus no longer be considered as different layers, thereby defining a combined layer having a thickness 218b, that is greater than a corresponding layer thickness 218a in the dielectric layer stack 226. Consequently, an efficient stress transfer mechanism is provided for the first and the second transistor elements 200N, 200P by substantially avoiding any material residues, such as the residues 116R in the conventional technique, while still providing a reliable control of any involved etch processes.

Figure 2H:
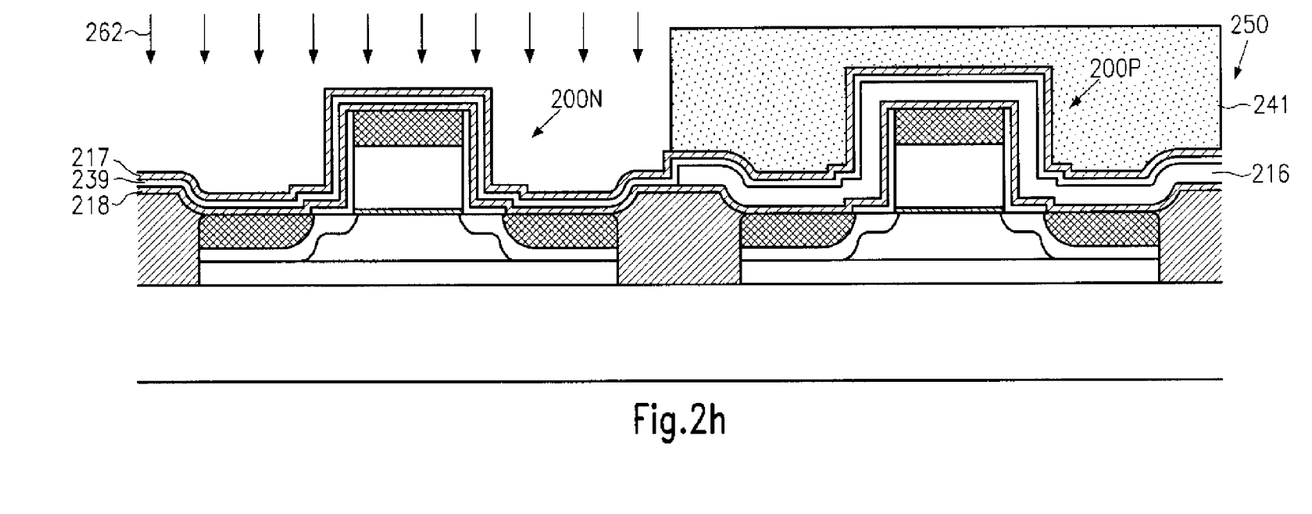
FIGS. 2h-2i schematically show a cross-sectional view of a semiconductor device similar to the device shown in FIGS. 2a-2g in a specific manufacturing stage, in which an additional stress-inducing liner is formed in combination with an etch stop layer according to further illustrative embodiments of the present invention.

With reference to FIG. 2h, a further illustrative embodiment will be described, in which the stress transfer mechanism in the first transistor element 200N may be enhanced by effectively reducing a thickness of any intermediate material between the second contact etch stop layer 219 and any lower-lying transistor regions.

In FIG. 2h, the semiconductor device 250 may have experienced a process sequence as described with reference to FIGS. 2a-2e, that is, the first contact etch stop layer 216 is formed above the second transistor element 200P while it is removed from the first transistor element 200N. Moreover, after the removal of the portion of the layer 216 from the first transistor element 200N, a liner 239 may be formed on the exposed portion of the first etch stop layer 218 and the first contact etch stop layer 216. The liner 239 may be, for instance, comprised of silicon nitride having a second type of intrinsic stress which differs from the first type of intrinsic stress of the first contact etch stop layer 216 and is selected to enhance the performance of the first transistor element 200N. Thus, the liner 239 may be formed according to the same principles as previously described with reference to the layer 219. Thereafter, the second etch stop layer 217 may be formed on the liner 239 in a similar fashion as is previously described with reference to FIG. 2f. Subsequently, a resist mask 241 may be formed to cover the second transistor element 200P, i.e., the layer portions formed thereon, while exposing the first transistor 200N, i.e., the layer portions formed thereon.

Thereafter, the device 250 may be subjected to an etch process 262 which may be designed as any appropriate wet chemical etch process or plasma-based etch process for removing the exposed portion of the etch stop layer 217. For example, well-approved selective etch recipes may be used when the etch stop layer 217 is comprised of silicon dioxide and the liner 239 is comprised of silicon nitride. Thereafter, the resist mask 241 may be removed and the further processing may be continued in a similar fashion as is described with reference to FIG. 2f, i.e., the second contact etch stop layer 219 may be formed and may be subsequently removed from the second transistor element 200P, while the etch stop layer 217 enables a corresponding control of the etch process. It should be appreciated that afterwards the etch stop layer 217 may be removed by any appropriate etch process. In some embodiments, when the influence of the liner 239 above the first contact etch stop layer 216 is considered inappropriate, a corresponding etch process may be performed to remove at least a portion of the material of the liner 239. In other illustrative embodiments, the entire device 250 may be subjected to an appropriately designed etch process for removing material from the second contact stop layer 219 as well as from the still exposed liner 239 formed on the first contact etch stop layer 216.

Figure 2I:
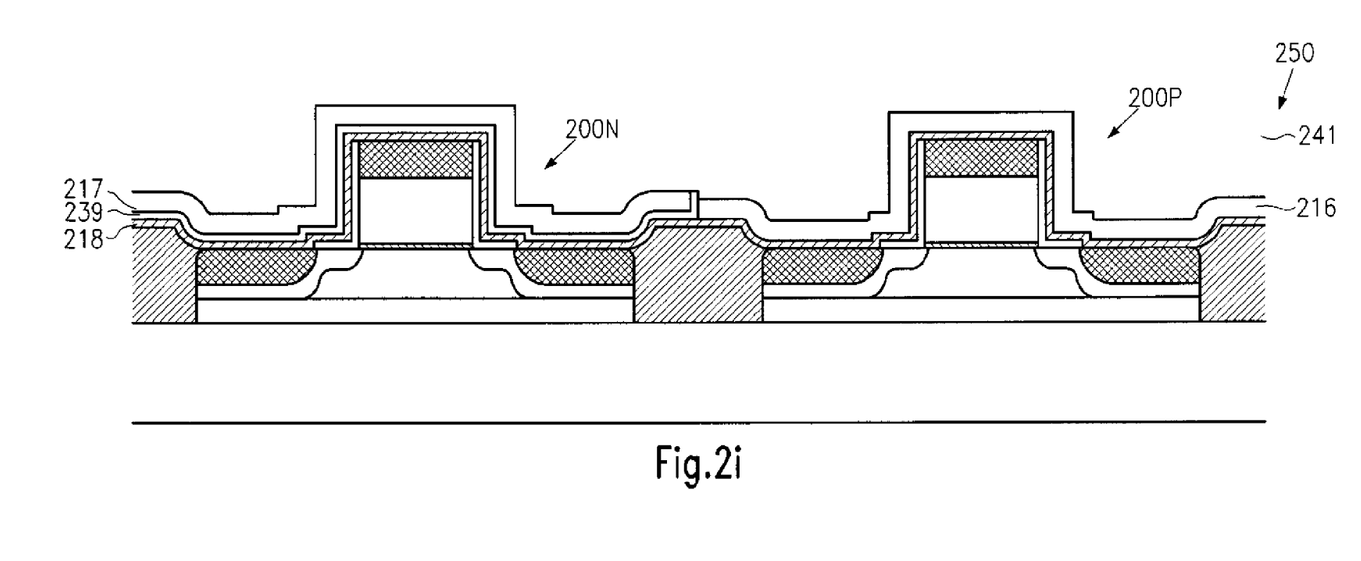

FIG. 2i schematically shows the semiconductor device 250 after the completion of the above-described process sequence, wherein an embodiment is shown in which the liner 239 is substantially completely removed from above the first contact etch stop layer 216. Consequently, the device 250 comprises the liner 239 and the second contact etch stop layer 219 having substantially the same intrinsic stress, thereby still further enhancing the stress transfer mechanism in the first transistor element 200N, while the second transistor 200P has its efficient stress transfer mechanism still maintained. It should be appreciated that, during the deposition of the second contact etch stop layer 219, the thickness of the liner 239 may be taken into consideration so as to obtain the desired target thickness.

It should be appreciated that the above-described process sequence may be changed in any way in accordance with process and device requirements. For example, the masking regime may be applied in a complementary manner and the first and second intrinsic stresses may be inverted in order to obtain the same process result.

As a result, the present invention provides an improved technique for forming differently strained transistor elements on the basis of a dielectric layer stack including respective contact etch stop layers having different intrinsic stress. Hereby, the stress transfer mechanism is enhanced by first removing any sidewall spacers and subsequently forming the strain-inducing contact etch stop layers, wherein the involved etch stop layer configuration is provided in such a way that unwanted contact etch stop layer portions may be removed highly efficiently. Thus, any material residues as are typically observed in the conventional process scheme may be significantly reduced or even completely avoided. Moreover, in some embodiments, a substantially symmetric arrangement with respect to the stress transfer mechanism may be maintained by providing an intermediate liner having a specified stress. Consequently, transistor performance of highly scaled devices having feature sizes of 50 nm and even less may be enhanced by an efficient strain engineering, while nevertheless a high degree of integrity of the metal silicide regions is guaranteed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first etch stop layer above a first transistor element and a second transistor element;
    forming a first contact etch stop layer above said first etch stop layer, said first contact etch stop layer having a first type of intrinsic stress;
    forming a first mask layer above said first and second transistor elements to expose said first contact etch stop layer over said first transistor element and cover said second transistor element;
    removing a first portion of said first contact etch stop layer formed above said first transistor element by an etch process using said first etch stop layer as an etch stop;
    forming a second etch stop layer above said first and second transistor elements; and forming a second contact etch stop layer on said second etch stop layer, said second contact etch stop layer having a second type of intrinsic stress other than said first type.

2. The method of claim 1, wherein each of said first and second transistor elements comprises a spacer element formed adjacent to a gate electrode structure, said method further comprising removing said spacer element prior to forming said first etch stop layer.

3. The method of claim 2, further comprising selectively removing a portion of said second contact etch stop layer formed above said second transistor element by using said second etch stop layer as an etch stop.

4. The method of claim 3, further comprising selectively removing said second etch stop layer above said second transistor element.

5. The method of claim 3, further comprising removing material from an exposed portion of said liner.

6. The method of claim 1, further comprising forming a liner above said first and second transistor elements and forming said second etch stop layer on said liner.

7. The method of claim 6, further comprising selectively removing a portion of said second etch stop layer formed above said first transistor element prior to forming said second contact etch stop layer.

8. The method of claim 7, further comprising selectively removing said second etch stop layer above said second transistor element.

9. The method of claim 7, further comprising removing material from an exposed portion of said liner.

10. The method of claim 1, wherein said first transistor element is an N-channel transistor, said second transistor element is a P-channel transistor and said first type of stress is compressive.

11. The method of claim 1, wherein said first transistor element is a P-channel transistor, said second transistor element is an N-channel transistor and said first type of stress is tensile.

12. A method, comprising:
forming a first etch stop layer above a first transistor element and a second transistor element;
forming a first contact etch stop layer above said first etch stop layer, said first contact etch stop layer having a first type of intrinsic stress;
forming a first mask layer above said first and second transistor elements to expose said first transistor element and cover said second transistor element;
removing a first portion of said first contact etch stop layer formed above said first transistor element by an etch process using said first etch stop layer as an etch stop;
forming a liner above said first and second transistor elements and forming said second etch stop layer on said liner;
forming a second etch stop layer above said first and second transistor elements on said liner; and
forming a second contact etch stop layer on said second etch stop layer, said second contact etch stop layer having a second type of intrinsic stress other than said first type, and wherein said liner exhibits said second type of intrinsic stress.

13. The method of claim 12, wherein each of said first and second transistor elements comprises a spacer element formed adjacent to a gate electrode structure, said method further comprising removing said spacer element prior to forming said first etch stop layer.

14. The method of claim 13, further comprising selectively removing a portion of said second contact etch stop layer formed above said second transistor element by using said second etch stop layer as an etch stop.

15. The method of claim 14, further comprising selectively removing said second etch stop layer above said second transistor element.

16. The method of claim 14, further comprising removing material from an exposed portion of said liner.

17. The method of claim 12, further comprising selectively removing a portion of said second etch stop layer formed above said first transistor element prior to forming said second contact etch stop layer.

18. The method of claim 17, further comprising selectively removing said second etch stop layer above said second transistor element.

19. The method of claim 17, further comprising removing material from an exposed portion of said liner.

20. The method of claim 12, wherein said first transistor element is an N-channel transistor, said second transistor element is a P-channel transistor and said first type of stress is compressive.

21. The method of claim 12, wherein said first transistor element is a P-channel transistor, said second transistor element is an N-channel transistor and said first type of stress is tensile.

* * * * *